United States Patent
Norrgard et al.

(10) Patent No.: US 7,411,383 B2
(45) Date of Patent: Aug. 12, 2008

(54) METHOD AND APPARATUS FOR DISCHARGING VOLTAGES FROM A CIRCUIT UNDER TEST

(75) Inventors: Dayton Norrgard, Loveland, CO (US); Ronald J. Peiffer, Loveland, CO (US); Kevin L. Wible, Loveland, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 426 days.

(21) Appl. No.: 11/233,710

(22) Filed: Sep. 23, 2005

(65) Prior Publication Data

US 2006/0139824 A1    Jun. 29, 2006

Related U.S. Application Data

(63) Continuation-in-part of application No. 11/023,893, filed on Dec. 28, 2004, now Pat. No. 7,132,876.

(51) Int. Cl.
*G01R 31/00* (2006.01)

(52) U.S. Cl. .................................................. 324/158.1

(58) Field of Classification Search ........................ None
See application file for complete search history.

(56) References Cited

U.S. PATENT DOCUMENTS 7,029,932 B1 * 4/2006 Hiser et al. .................. 438/14

OTHER PUBLICATIONS

Ron J. Peiffer, et al., "System for Discharging Electronic Circuitry", U.S. Appl. No. 11/023,893, filed on Dec. 28, 2004.

* cited by examiner

*Primary Examiner*—Vinh P Nguyen

(57) ABSTRACT

In one embodiment, voltages are discharged from a circuit under test by, after pins of a circuit tester have been coupled to nodes of the circuit under test, making a first one of the pins an active pin and executing a current discharge process for the active pin. The current discharge process couples a current discharge circuit to the active pin, and then enables the current discharge circuit. A voltage of the active pin is then measured and, if the measured voltage is within a defined window, the active pin is coupled to ground. However, if the measured voltage is outside of the defined window after the current discharge circuit has been enabled for a predetermined period of time, the active pin is marked as not discharged. The current discharged circuit is then disabled and decoupled from the active pin. Thereafter, a next one of the pins is made the active pin, and the current discharged process is caused to be repeated.

24 Claims, 3 Drawing Sheets

METHOD AND APPARATUS FOR
DISCHARGING VOLTAGES FROM A
CIRCUIT UNDER TEST

CROSS-REFERENCE TO RELATED
APPLICATION

This is a continuation in part of application Ser. No. 11/023,893 filed on Dec. 28, 2004, now U.S. Pat. No. 7,132,876 the entire disclosure of which is incorporated into this application by reference.

BACKGROUND

Electrical circuits (e.g., circuit boards) may be tested both during and after manufacture. Circuits can be tested to identify both component defects and assembly defects.

Some components, such as capacitors and batteries, are capable of storing energy. When automated test equipment (ATE) is coupled to one of these components (either directly or indirectly), the component can discharge its energy and potentially damage the ATE or other components of the circuit under test. Components such as capacitors can be especially dangerous, because their states are more likely to change between test processes (whereas batteries are more likely to remain charged throughout testing).

One approach for protecting ATE from energy discharge is to provide ATE with cross-connect relays with higher current ratings. However, this approach does not protect circuits under test from short circuit damage. Nor does it reduce wear on ATE resources. The higher rated components also add additional cost.

Another approach, for protecting both ATE and circuits under test from energy discharge, is to incorporate algorithms for identifying potential energy sources into test development software (e.g., by examining board topology). Software can then be used to write tests that cause the potential energy sources to discharge prior to testing. One weakness of this approach, however, is that it often depends on human operators to provide correct inputs, such as correct circuit topology information.

Yet another approach for protecting ATE and circuits under test is to incorporate one or more discharge mechanisms into a custom fixture for each circuit under test.

A typical problem with all of these approaches is that stray charges may "walk" around the board. That is, after discharging one electrical net, a non-discharged energy source may cause energy to leak back into the already discharged electrical net. And, even if a stray charge is small enough that it does not damage ATE or other circuitry, it may be significant enough to cause errors in circuit test measurements—especially when a circuit is submitted to low voltage and low current tests.

Also, the last two of the above approaches are susceptible to human error. That is, their approaches vary based on circuit topology, and therefore require different methodologies for different circuits under test.

SUMMARY OF THE INVENTION

In one embodiment, a method of discharging voltages from a circuit under test comprises, after pins of a circuit tester have been coupled to nodes of the circuit under test, making a first one of the pins an active pin and executing a current discharge process for the active pin. The current discharge process comprises coupling a current discharge circuit to the active pin, and then enabling the current discharge circuit. A voltage of the active pin is then measured and, if the measured voltage is within a defined window, the active pin is coupled to ground. However, if the measured voltage is outside of the defined window after the current discharge circuit has been enabled for a predetermined period of time, the active pin is marked as not discharged. The current discharge circuit is then disabled and decoupled from the active pin. Thereafter, a next one of the pins is made the active pin, and the current discharge process is caused to be repeated.

In another embodiment, a circuit tester comprises a plurality of pins and a current discharge circuit. The current discharge circuit has a voltage measurement circuit that is coupled to measure a voltage at an input to the current discharge circuit. The circuit tester also comprises a discharge bus via which the input to the current discharge circuit can be switched into contact with an active one of the plurality of pins, and a ground bus via which ones of the pins can be switched into contact with a ground. The circuit tester further comprises a control system to, after the plurality of pins has been coupled to nodes of a circuit under test, make one of the pins the active pin and execute a current discharge process. The current discharge process causes the input of the current discharge circuit to be coupled to the active pin via the discharge bus, and then enables the current discharge circuit. If the voltage measured by the voltage measurement circuit is within a defined window, the control system causes the active pin to be coupled to ground via the ground bus. Otherwise, if the voltage measured by the voltage measurement circuit is outside of the defined window after the current discharge circuit has been enabled for a predetermined period of time, the control system causes the active pin to be marked as not discharged. Finally, the control system 1) causes the current discharge circuit to be disabled and decoupled from the active pin, and 2) makes a next one of the pins the active pin and causes the current discharge process to be repeated.

Other embodiments are also disclosed.

BRIEF DESCRIPTION OF THE DRAWINGS

Illustrative embodiments of the invention are illustrated in the drawings, in which.

DETAILED DESCRIPTION

Figure 1:
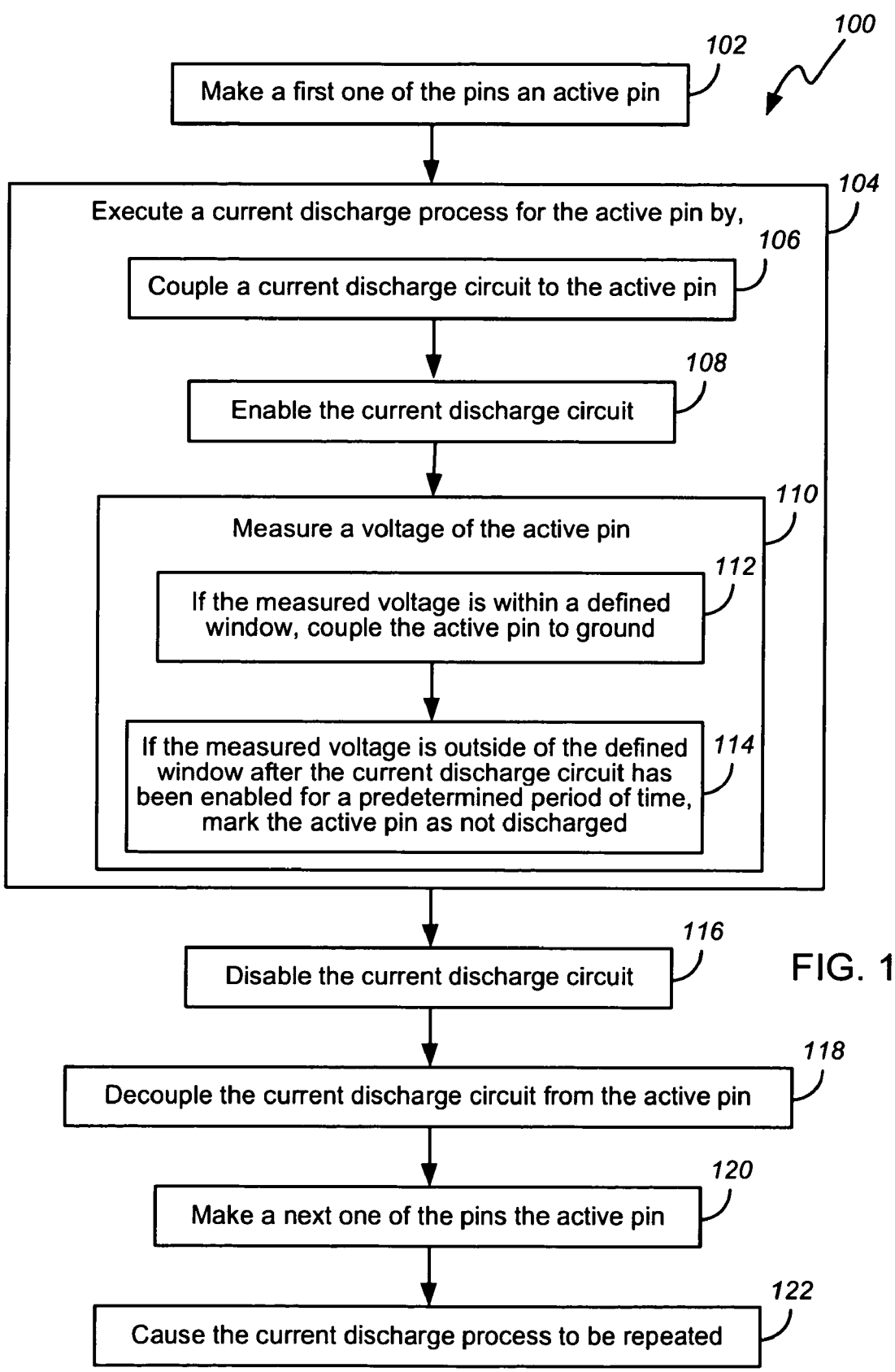
FIG. 1 illustrates an exemplary method for discharging voltages from a circuit under test.

FIG. 1 illustrates an exemplary method 100 for discharging voltages from a circuit under test. The method 100 presumes that the pins of a circuit test have been coupled to nodes of a circuit under test, and begins with making 102 a first one of the pins an "active pin". The method 100 then proceeds to execute a current discharge process 104 for the active pin.

The current discharge process 104 comprises coupling 106 a current discharge circuit to the active pin, and then enabling 108 the current discharge circuit. Either before or after the current discharge circuit is activated, the voltage of the active pin is measured 110. If the measured voltage is within a defined window, the active pin is coupled 112 to ground. However, if the measured voltage is outside of the defined window after the current discharge circuit has been enabled for a predetermined period of time, the active pin is marked 114 as "not discharged". The current discharge circuit is then disabled 116 and decoupled 118 from the active pin. Thereafter, a next one of the pins is made the active pin 120, and the current discharge process is caused 122 to be repeated.

An exemplary application of the method 100 will be described in the context of the circuit tester 200 and circuit 202 under test shown in FIG. 2. However, before describing the exemplary application of the method 100, an exemplary embodiment of the circuit tester 200 will be described.

By way of example, the circuit tester 200 is shown to have a plurality of pins 204, 206, 208, 210, 212 a current discharge circuit 214, a discharge bus 216, a ground bus 218 and a control system 220. As shown, the pins 204, 206, 208, 210, 212 are configured to be coupled to a circuit 202 under test. By way of example, the circuit under test is shown to comprise a circuit board 214 with five nodes (N1-N5). A battery (V) is coupled between nodes N1 and N2; a resistor (R) is coupled between nodes N2 and N4; and a capacitor (C) is coupled between nodes N4 and N5. During circuit test, and as shown, the pins 204, 206, 208, 210, 212 of the circuit tester 200 may be respectively coupled to the nodes N1-N5.

The current discharge circuit 214 may take various forms, including the forms which are shown in the U.S. patent application Ser. No. 11/023,893 of Peiffer, et al. entitled, "System for Discharging Electronic Circuitry". As disclosed by Peiffer, a current discharge circuit may comprise circuitry for initiating both positive and negative current flows, thereby enabling the discharge of both positive and negative charges. As also disclosed by Peiffer, and as shown in FIG. 2, the current discharge circuit 214 may also comprise a voltage measurement circuit 222. The voltage measurement circuit 222 is coupled to an input 224 of the current discharge circuit 214 to measure a voltage at the input 224.

The discharge bus 216 may also take various forms and provides a means by which the input 224 to the current discharge circuit 214 can be switched into contact with an active one of the plurality of pins 204, 206, 208, 210, 212. In one embodiment, the bus 216 comprises a line 226 that routes the input 224 to each of the switches S1-S5, and control lines 228 for operating each of the switches S1-S5. Each of the switches S1-S5 serves to couple the line 226 to one of the pins 204, 206, 208, 210, 212.

The ground bus 218 may also take various forms and provides a means by which any one or more of the pins 204, 206, 208, 210, 212 may be coupled to a ground (GND). In one embodiment, the bus 218 comprises a line 230 that routes the ground (GND) to each of the switches G1-G5 and control lines 232 for operating each of the switches G1-G5. Each of the switches G1-G5 serves to couple the ground (GND) to one of the pins 204, 206, 208, 210, 212.

The control lines 228 and 232 are coupled to the control system 220. The control system 220 is preferably a microprocessor under control of software. Alternately, the control system 220 could comprise a field programmable gate array (FPGA) or other programmed logic.

Figure 2:
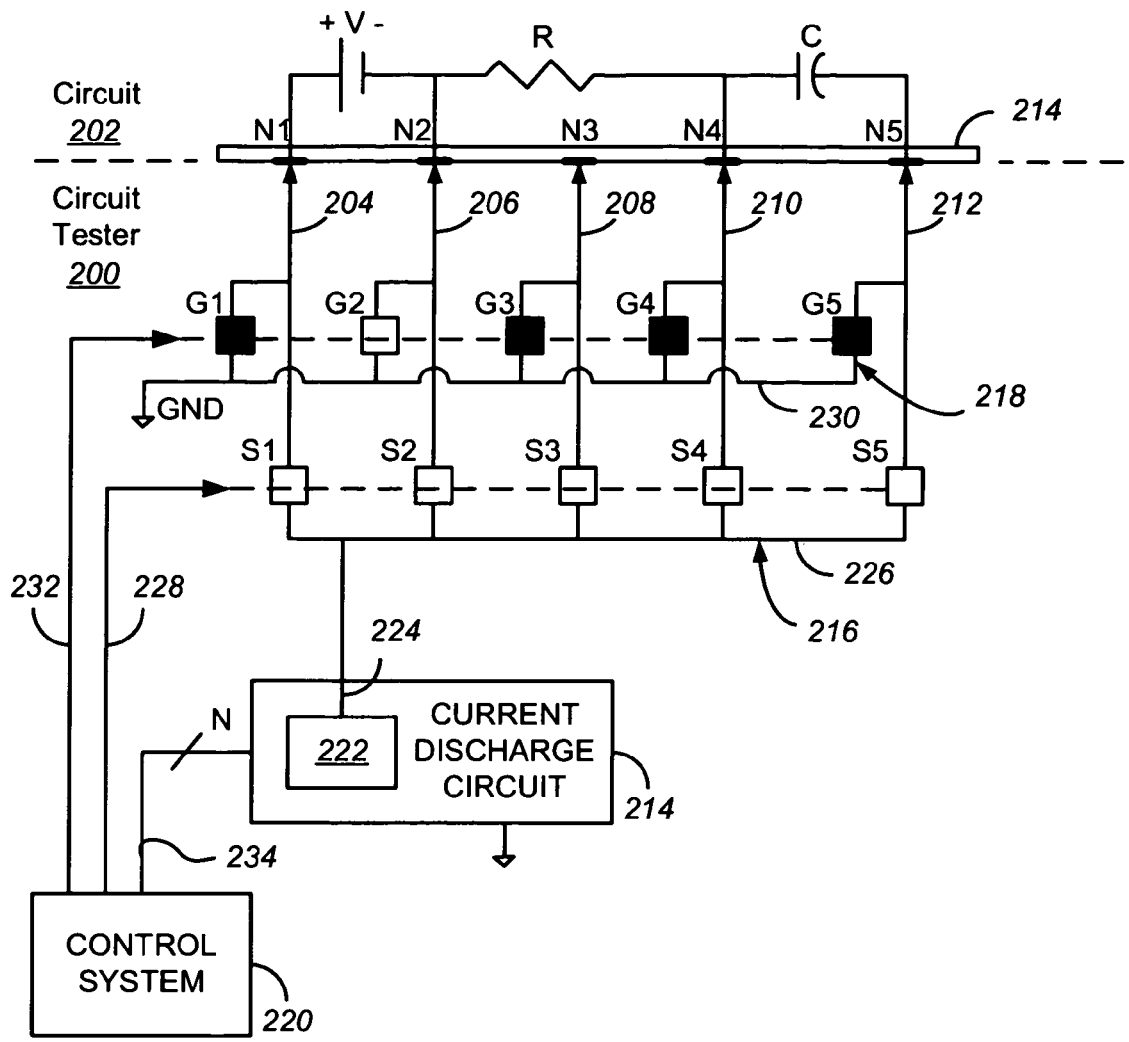
FIG. 2 illustrates a first exemplary circuit tester for implementing the method shown in FIG. 1.

Although FIG. 2 illustrates the control system 220 as a single "black box" structure, the control system 220 could alternately be a distributed control system. For example, portions of the control system could reside within the current discharge circuit 214.

The control system 220 may control other components of the circuit tester 200 to implement the method 100 as follows. After the plurality of pins 204, 206, 208, 210, 212 have been coupled to respective nodes (e.g., nodes N1-N5) of a circuit 202 under test, the control system 220 makes one of the pins 204 the active pin and executes the current discharge process 104 shown in FIG. 1.

In accord with the current discharge process 104, the control system 220 causes the input 224 of the current discharge circuit 214 to be coupled to the active pin 204 via the discharge bus 216 (e.g., by sending a control signal to close the switch S1). The control system 220 then enables the current discharge circuit 214. If the voltage measured by the voltage measurement circuit 222 is within a defined window (which in many cases will be limited to zero volts, or a small range of voltages about zero volts), the control system 220 causes the active pin 204 to be coupled to ground via the ground bus 218 (e.g., by sending a control signal to close the switch G1). However, if the voltage measured by the voltage measurement circuit 222 remains outside of the defined window after the current discharge circuit 214 has been enabled for a predetermined period of time, the control system 220 leaves the switch G1 open and causes the active pin 204 to be marked as not discharged. In one embodiment, this comprises isolating the active pin from resources of the circuit tester 200. In this manner, the non-discharged pin will not damage the circuit tester and/or other components of the circuit board 214.

After completion of the current discharge process 104, the control system 220 causes the current discharge circuit 214 to be disabled and decoupled from the active pin 204 (e.g., by sending a control signal to open the switch S1). Thereafter, the control system 220 proceeds to make a next one of the pins 206 the active pin, and causes the current discharge process 104 to be repeated for the new active pin 206. The control system 220 then repeats the above process until 1) an attempt has been made to discharge all of the pins 204, 206, 208, 210, 212, and 2) all of the pins 204, 206, 208, 210, 212 have either been grounded or isolated.

With respect to the circuit 202 under test, and assuming that pin 204 is the first pin that the control system 220 makes active, the voltage measurement circuit 222 will fail to sense a voltage during the current discharge process 104 (i.e., because the opposite end of the battery (V) remains floating), and the control system 220 will therefore close switch G1 to ground pin 204. The closed state of switch G1 is indicated in FIG. 2 by the black fill of the switch.

Next, the control system 220 may make the pin 206 active. This time, however, with the battery (V) coupled between the pin 206 and ground, the current discharge circuit 214 will be unable to discharge the battery, and the voltage measurement circuit 222 will report a voltage that is outside of its defined window. The pin 206 will therefore be isolated from tester resources.

Upon making pin 208 active, which is not connected to any components of the circuit board 214, the voltage measurement circuit 222 will again fail to sense a voltage, and the control system 220 will close switch G3 to ground pin 208.

Proceeding to pin 210, if the value of the resistor (R) is small, the voltage measurement circuit 222 will report a voltage that is outside of its defined window, and the pin 210 will be isolated. However, depending upon the size of the resistor (R), and the time allowed for discharge, the discharge circuit may be able to effectively discharge the voltage on the pin (i.e., to within a defined window). In this case, the voltage measurement circuit 222 will report a voltage that is within its defined window, and the pin 210 will be coupled to ground by closing the switch G4.

Finally, the control system 220 will make the pin 212 active. If the capacitor (C) stores a great enough charge, the current discharge circuit 214 may not be able to discharge the capacitor, and the voltage measurement circuit 222 may report a voltage that is outside of its defined window. In this case, the pin 212 will be isolated. However, if the charge on the capacitor (C) can be discharged, the pin 212 will be grounded by closing the switch G5.

The voltage measurement circuit 222 may take voltage measurements at various times. In one embodiment, the voltage measurement circuit 222 takes a voltage measurement soon after the current discharge circuit 214 is coupled to an active pin. In this manner, it may be possible to shorten or skip the current discharge process 104 when an active pin carries no charge. In other embodiments, the voltage measurement circuit 222 may take continuous or periodic measurements, and a pin may be coupled to ground as soon as the measured voltage of the pin falls within the defined window of the voltage measurement circuit 222. In still other embodiments, the voltage measurement circuit 222 may simply take a single measurement, after the current discharge circuit 214 has been coupled to a pin for a predetermined period of time. In yet another embodiment, the time to discharge a pin may be recorded, and the recorded time may be used by the control system 220 to approximate and adjust the predetermined period of time for which a current discharge circuit 214 is activated during a discharge cycle.

In one embodiment, the current discharge circuit 214 is provided with a timer. The timer is started when the current discharge circuit 214 is coupled to the active pin. Upon expiration of the timer, the voltage measurement circuit 222 is then caused to take a voltage measurement.

The control system 220 may determine whether the voltage measured by the voltage measurement circuit 222 is outside of its defined window in a plurality of ways. In one embodiment, the state of the voltage measured by the circuit 222 may be reported via a pin status bus 234 coupled between the current discharge circuit 214 and the control system 220.

The pin status bus 234 may implement various protocols. For example, in one embodiment, a line of the pin status bus 234 may be biased to a first state (e.g., a logic low state). When the voltage measured by the voltage measurement circuit 222 is outside of its defined window, and the current discharge circuit 214 has been enabled for a predetermined period of time, the voltage measurement circuit 222 may cause the pin status bus 234 to be pulled to a second state (e.g., a logic high state). By monitoring the state of the pin status bus 234 (e.g., by periodically polling the bus 234), the control system 220 may then determine whether the voltage measured by the circuit 214 is outside of its defined window.

In some cases, the current discharge circuit 214 may further comprise a circuit for recording the voltage remaining on the active pin, and/or a circuit for recording the time that was needed to discharge the active pin. If such a circuit is provided, the pin status bus 234 may comprise additional lines via which the control system 220 may read the voltage remaining on the active pin, or the time that was needed to discharge the active pin.

In some cases, the control system 220 may be programmed to execute its current discharge processes 104 before unpowered testing of the circuit 202 under test. In this manner, energy sources may be discharged or isolated prior to the unpowered testing. In other cases, the control system 220 may also (or alternately) be programmed to repeat (or execute) its current discharge processes 104 after powered testing of the circuit under test. In this manner, energy sources that were charged as a result of testing can be safely grounded or isolated prior to additional handling of the circuit 202.

Figure 3:
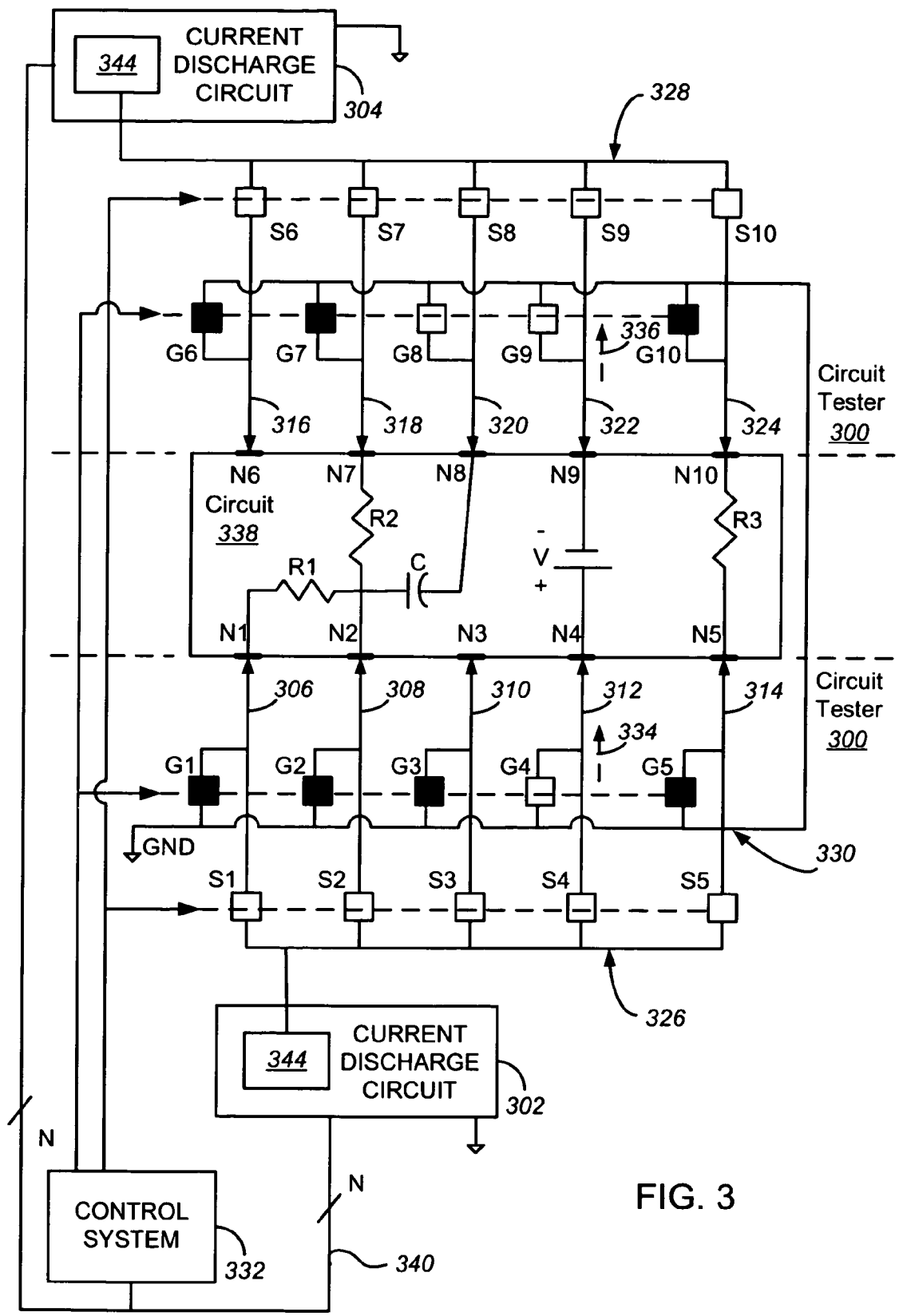
FIG. 3 illustrates a second exemplary circuit tester for implementing the method shown in FIG. 1.

FIG. 3 illustrates an alternative application of the method 100. In FIG. 3, the circuit tester 300 comprises a plurality of current discharge circuits 302, 304, each of which is coupled to a different subset of pins of the circuit tester 300 (i.e., the set of pins 306, 308, 310, 312 and 314; or the set of pins 316, 318, 320, 322 and 324) via one of a plurality of discharge buses 326, 328. Each of the tester's pins is also coupled to a ground bus 330.

Although FIG. 3 illustrates only two current discharge circuits 302, 304 and two discharge buses 326, 328, additional discharge circuits and discharge buses could be added to the circuit tester 300, as would be understood by one of ordinary skill in the art after having reviewed the description and illustration of the circuit tester 300.

As shown, the pins of the circuit tester 300 may be coupled to a circuit 338 under test. Alternately, different pins of the circuit tester could be coupled to different circuits under test, or to different discrete modules or components of a circuit under test.

The plural current discharge circuits 302, 304 of the tester 300 enable the control system 332 to execute parallel (i.e., concurrent) current discharge processes 104 for each of the tester's discharge circuits 302, 304. In this manner, energy may be discharged from each of a plurality of pin sequences (e.g., the sequence of pins 306, 308, 310, 312 and 314; and the sequence of pins 316, 318, 320, 322 and 324) in parallel. As compared to the circuit tester 200, the circuit tester 300 enables the nodes of a circuit under test to be discharged in M/N parallel (i.e., concurrent) iterations of the current discharge process 104 (where M is the total number of a tester's pins; and N is the tester's number of current discharge circuits).

In some cases, parallel operation of multiple discharge circuits 302, 304 may create a current loop across multiple discharge circuits 302, 304. For example, when the discharge circuits 302 and 304 are simultaneously coupled to the pins 312 and 322, a current loop may be formed as illustrated by the broken arrows 334 and 336. In such a case, one or both of the discharge circuits 302, 304 may be unable to pull the voltage of a pin to within a defined window, and both of the currently active pins may be marked as non-discharged.

As further shown in FIG. 3, the pin status bus 340 of the circuit tester 300 may be coupled to each of the tester's current discharge circuits 302, 304. When a particular one of the current discharge circuits 302, 304 measures a voltage that is outside of the defined window of its voltage measurement circuit 342, 344, its voltage measurement circuit may cause the bus 340 to be pulled to its second state.

Given that either of the voltage measurement circuits 342, 344 may pull the bus 340 to its second state (and both may do so simultaneously), the bus 340 serves as a "party" bus. As a result, and upon determining that the bus 340 has changed state, the control system 332 may then poll (or query) both of the current discharge circuits 302, 304 to determine which one(s) of the current discharge circuits 302, 304 caused the bus 340 to be pulled to its second state. Upon making this determination, the control system 332 may mark an appropriate pin or pins as protected (and may isolate them from tester resources). On the other hand, if the current discharge process 104 (FIG. 1) is concurrently executed by all of the current discharge circuits 302, 304 that are attached to the bus 340, and the processes complete without a change in the state of the bus 340, then the control system 332 may simultaneously close the ground switches that are associated with all of the currently active pins (i.e., the control system 332 may simultaneous close multiple ones of the switches G1-G10).

What is claimed is:

1. A method of discharging voltages from a circuit under test, comprising:
   after pins of a circuit tester have been coupled to nodes of the circuit under test, making a first one of the pins an active pin, and executing a current discharge process for the active pin by,
   coupling a current discharge circuit to the active pin and then enabling the current discharge circuit;
   measuring a voltage of the active pin and,
   i) if the measured voltage is within a defined window, coupling the active pin to ground; and
   ii) if the measured voltage is outside of the defined window after the current discharge circuit has been enabled for a predetermined period of time, marking the active pin as not discharged; and
   disabling and decoupling the current discharge circuit from the active pin; and
   making a next one of the pins the active pin and causing the current discharge process to be repeated.

2. The method of claim 1, wherein the method is performed before unpowered testing of the circuit under test.

3. The method of claim 2, wherein the method is repeated after powered testing of the circuit under test.

4. The method of claim 1, wherein the method is performed after powered testing of the circuit under test.

5. The method of claim 1, wherein the defined window is zero volts.

6. The method of claim 1, wherein marking the active pin as not discharged comprises isolating the active pin from resources of the circuit tester.

7. The method of claim 1, further comprising, when the measured voltage is outside of the defined window after the current discharge circuit has been enabled for a predetermined period of time, changing the state of a pin status bus.

8. The method of claim 1, further comprising, when the measured voltage is outside of the defined window after the current discharge circuit has been enabled for a predetermined period of time, recording the voltage remaining on the active pin.

9. The method of claim 1, further comprising, recording the time that was needed to discharge the active pin.

10. The method of claim 9, further comprising, using the time(s) to discharge one or more active pins to estimate and adjust the predetermined period of time for which the current discharge circuit is enabled during a later repetition of the current discharge process.

11. The method of claim 1, further comprising, in parallel with executing the current discharge process for each of a first sequence of the circuit tester's pins, executing the current discharge process for each of a second sequence of the circuit tester's pins, in conjunction with a second current discharge circuit.

12. A circuit tester, comprising:
   a control system to,
   make a first pin of a circuit tester an active pin, and execute a current discharge process for the active pin by,
   causing a current discharge circuit to be coupled to the active pin, and then causing the current discharge circuit to be enabled;
   causing a voltage of the active pin to be measured and,
   i) if the measured voltage is within a defined window, causing the active pin to be coupled to ground; and
   ii) if the measured voltage is outside of the defined window after the current discharge circuit has been enabled for a predetermined period of time, causing the active pin to be marked as not discharged; and
   causing the current discharge circuit to be disabled and
   decoupled from the active pin; and
   make a next one of the pins the active pin and cause the current discharge process to be repeated.

13. A circuit tester, comprising:
   a plurality of pins;
   a current discharge circuit having a voltage measurement circuit, the voltage measurement circuit being coupled to measure a voltage at an input to the current discharge circuit;
   a discharge bus via which the input to the current discharge circuit can be switched into contact with an active one of the plurality of pins;
   a ground bus via which ones of the plurality of pins can be switched into contact with a ground; and
   a control system to,
   after the plurality of pins have been coupled to nodes of a circuit under test, make one of the pins the active pin and execute a current discharge process by,
   causing the input of the current discharge circuit to be coupled to the active pin via the discharge bus;
   enabling the current discharge circuit and,
   i) if the voltage measured by the voltage measurement circuit is within a defined window, causing the active pin to be coupled to ground via the ground bus; and
   ii) if the voltage measured by the voltage measurement circuit is outside of the defined window after the current discharge circuit has been enabled for a predetermined period of time, causing the active pin to be marked as not discharged; and
   causing the current discharge circuit to be disabled and
   decoupled from the active pin; and
   make a next one of the pins the active pin and cause the current discharge process to be repeated.

14. The circuit tester of claim 13, wherein the control system executes its current discharge processes before unpowered testing of the circuit under test.

15. The circuit tester of claim 14, wherein the control system repeats its current discharge processes after powered testing of the circuit under test.

16. The circuit tester of claim 13, wherein the control system executes its current discharge processes after powered testing of the circuit under test.

17. The circuit tester of claim 13, wherein the defined window is zero volts.

18. The circuit tester of claim 13, wherein the control system marks the active pin as not discharged by isolating the active pin from resources of the circuit tester.

19. The circuit tester of claim 13, further comprising a pin status bus, biased to a first state and coupled between the control system and the current discharge circuit, wherein:
   when the voltage measured by the voltage measurement circuit is outside of the defined window after the current discharge circuit has been enabled for a predetermined period of time, the voltage measurement circuit causes the pin status bus to be pulled to a second state; and
   the control system determines if i) the voltage measured by the voltage measurement circuit is within the defined window, or ii) the voltage measured by the voltage measurement circuit is outside of the defined window after the current discharge circuit has been enabled for a predetermined period of time, by monitoring the state of the pin status bus.

20. The circuit tester of claim 13, further comprising a pin status bus, coupled between the control system and the current discharge circuit, wherein:
   the current discharge circuit comprises a circuit for recording the voltage remaining on the active pin; and
   the control system reads the voltage remaining on the active pin via the pin status bus.

21. The circuit tester of claim 13, further comprising a pin status bus, coupled between the control system and the current discharge circuit, wherein:
   the current discharge circuit comprises a circuit for recording the time that was needed to discharge the active pin; and
   the control system reads the time that was needed to discharge the active pin via the pin status bus.

22. The circuit tester of claim 21, wherein the control system uses the time(s) to discharge one or more active pins to estimate and adjust the predetermined period of time for which the current discharge circuit is enabled during a later repetition of the current discharge process.

23. The circuit tester of claim 13, further comprising,
   at least one additional current discharge circuit, each of which has a voltage measurement circuit that is coupled to measure a voltage at an input of its respective current discharge circuit; and
   at least one additional discharge bus, each of which is associated with a respective one of the at least one additional current discharge circuit, the at least one discharge bus enabling each of the at least one additional current discharge circuit to be switched into contact with ones of the plurality of pins;
   wherein the control system is further provided to, after the plurality of pins have been coupled to the nodes of the circuit under test, make at least one additional one of the pins active, and concurrently execute the current discharge process for each of the current discharge circuits, in combination with respective ones of the set of currently active pins.

24. The circuit tester of claim 23, further comprising a pin status bus, biased to a first state and coupled between the control system and each of the current discharge circuits, wherein:
   when the voltage measured by a particular one of the voltage measurement circuits is outside of the defined window after one of the current discharge circuits has been enabled for a predetermined period of time, the particular voltage measurement circuit causes the pin status bus to be pulled to a second state;
   the control system monitors the state of the pin status bus to determine if the voltage measured by any of the voltage measurement circuits is outside of its defined window after its current discharge circuit has been enabled for a predetermined period of time; and
   in response to determining that the pin status bus has been pulled to the second state, the control system polls each of the current discharge circuits to determine if its voltage measurement circuit measured a voltage that was outside of its defined window.

* * * * *

UNITED STATES PATENT AND TRADEMARK OFFICE
CERTIFICATE OF CORRECTION

PATENT NO. : 7,411,383 B2
APPLICATION NO. : 11/233710
DATED : August 12, 2008
INVENTOR(S) : Norrgard et al.

It is certified that error appears in the above-identified patent and that said Letters Patent is hereby corrected as shown below:

On the Title page, in Item (57), under "Abstract", in column 2, line 13, delete "discharged" and insert -- discharge --, therefor.

On the Title page, in Item (57), under "Abstract", in column 2, line 15, delete "discharged" and insert -- discharge --, therefor.

Signed and Sealed this

Fourth Day of November, 2008

JON W. DUDAS
*Director of the United States Patent and Trademark Office*